US006697130B2

(12) United States Patent
Weindorf et al.

(10) Patent No.: US 6,697,130 B2
(45) Date of Patent: Feb. 24, 2004

(54) FLEXIBLE LED BACKLIGHTING CIRCUIT

(75) Inventors: Paul F. L. Weindorf, Novi, MI (US); David R. Anderson, Aurora, OH (US)

(73) Assignee: Visteon Global Technologies, Inc., Dearborn, MI (US)

( * ) Notice: Subject to any disclaimer, the term of this patent is extended or adjusted under 35 U.S.C. 154(b) by 131 days.

(21) Appl. No.: 10/040,855

(22) Filed: Dec. 28, 2001

(65) Prior Publication Data

US 2002/0130985 A1 Sep. 19, 2002

Related U.S. Application Data

(60) Provisional application No. 60/261,760, filed on Jan. 16, 2001.

(51) Int. Cl.[7] .................. G02F 1/1333; G02F 1/1335; G02F 1/1345
(52) U.S. Cl. ................... 349/65; 349/58; 349/150; 349/152
(58) Field of Search ................. 349/65, 58, 150, 349/152, 96

(56) References Cited

U.S. PATENT DOCUMENTS

| | | |
|---|---|---|
| 3,925,690 A | 12/1975 | Spence |
| 4,090,189 A | 5/1978 | Fisher |
| 4,160,934 A | 7/1979 | Kirsch |
| 4,959,642 A | 9/1990 | Sharples |
| 5,359,691 A | 10/1994 | Tai et al. |
| 5,390,276 A | 2/1995 | Tai et al. |

(List continued on next page.)

FOREIGN PATENT DOCUMENTS

JP 409288278 A * 11/1997

OTHER PUBLICATIONS

Osram Opto Semiconductors brochure entitled "High Brightness—High Temperature Power Topled®", printed by Infineon Technologies, undated, 4 pages.
Osram Opto Semiconductors Innovative Technology Sets New Standards brochure entitled "Led in General Lighting," printed by Osram Sylvania, Inc., undated, 16 pages.
Osram OPTO Semiconductors brochure entitled "Led for Traffic Applications", printed by Infineon Technologies, undated, 9 pages.
Bond Ply™ 100 brochure entitled Thermally Conductive, Pressure Sensitive Adhesive Tape, printed by The Berquist Company, dated Jan. 25, 2001, 1 page.
Sheldahl product bulletin for Standard Flex, Single Layer Flexible Ciruucuit Interconnect, printed by Sheldahl, undated, 2 pages.

(List continued on next page.)

Primary Examiner—Julie Ngo
(74) Attorney, Agent, or Firm—Brinks Hofer Gilson & Lione

(57) ABSTRACT

A flexible circuit board mounted with top-light LEDs and LED control circuits provides a convenient and space efficient way to backlight an LCD. The flexible circuit board may have multiple tabs that are folded such that the top-light LEDs provide light into a light pipe from multiple directions. The top-light LEDs and LED control circuits may be located on the same side of the flexible circuit board for improved cost savings and manufacturability.

26 Claims, 4 Drawing Sheets

U.S. PATENT DOCUMENTS

| | | | |
|---|---|---|---|
| 5,422,756 A | | 6/1995 | Weber |
| 5,528,720 A | | 6/1996 | Winston et al. |
| 5,623,277 A | * | 4/1997 | Lippmann et al. .......... 345/101 |
| 5,828,488 A | | 10/1998 | Ouderkirk et al. |
| 5,986,730 A | * | 11/1999 | Hansen et al. ................ 349/96 |
| 6,069,448 A | | 5/2000 | Yeh |
| 6,069,449 A | | 5/2000 | Murakami |
| 6,107,985 A | | 8/2000 | Walukas et al. |
| 6,124,971 A | | 9/2000 | Ouderlirk et al. |
| 6,147,723 A | | 11/2000 | Mochizuki |
| 6,150,771 A | | 11/2000 | Perry |
| 6,160,663 A | * | 12/2000 | Merrill et al. ............... 359/500 |
| 6,322,236 B1 | * | 11/2001 | Campbell et al. ........... 362/333 |
| 6,342,932 B1 | * | 1/2002 | Terao et al. .................. 349/58 |
| 6,447,135 B1 | * | 9/2002 | Wortman et al. ............. 362/31 |
| 6,512,676 B1 | * | 1/2003 | Crapisi et al. ............... 361/752 |

OTHER PUBLICATIONS

Sheldahl product bulletin for Standard Flex, Double Layer Flexible Circuit Interconnect, printed by Sheldahl, undated, 2 pages.

Sheldahl product bulletin for *Novaflex®* HD, High Density Flexible Circuit Interconnect, printed by Sheldahl, undated, 2 pages.

Sheldahl product bulletin for *Novaflex®* VHD, Very High Density Flexible Circuit Interconnect, printed by Sheldahl, undated, 2 pages.

Sheldahl product listing for Flexible Interconnect Products, from <http://www.shedahl.com/Product/FlexInter.htm>, printed from the Internet on Sep. 13, 2001, 2 pages.

* cited by examiner

FLEXIBLE LED BACKLIGHTING CIRCUIT

CROSS REFERENCE TO RELATED APPLICATION

This application is based on U.S. Provisional Application No. 60/261,760 entitled "AMLCD LED Backlighting Navigation Radio Display" and filed on Jan. 16, 2001. The benefit of the filing date of the Provisional Application is claimed for this application. The entire contents of the Provisional Application are incorporated herein by reference.

FIELD

This invention relates generally to the field of light emitting diode ("LED") circuits. More specifically, this invention relates to the field of backlighting of liquid crystal displays ("LCDs") and other devices with a flexible circuit design.

BACKGROUND

Backlighting for active matrix liquid crystal displays ("AMLCD") typically uses a cold cathode fluorescent lamp ("CCFL") device. CCFL devices tend to have high back lighting efficacies. CCFL devices have numerous drawbacks. For example, CCFL devices may contain Mercury, a highly dangerous substance that has been banned from many AMLCD applications. CCFL devices may have poor efficacy at lower temperatures, which requires additional circuitry such as a heater element or a boost current circuit. CCFL devices may have a non-linear efficacy curve with respect to temperature. CCFL devices may require an inverter to drive the CCFL device. CCFL devices may require complex control schemes, including light sensors and temperature sensors to provide adequate dimming ratios for night time operations. CCFL devices may have a short life expectancy, especially at lower operating temperatures, and may require additional electromagnetic interference ("EMI") shielding and electric filtering.

Alternatives to CCFL devices for back lighting an AMLCD include Xenon-based devices. Xenon-based backlighting circuits do not contain Mercury, have superior low temperature life expectancy and low temperature operational characteristics, and have less phosphor degradation than CCFL devices. While Xenon lamps correct many of the problems of the CCFL lamp technology, the Xenon lamp technology creates many new problems. For example, Xenon lamps tend to be relatively expensive and require complex control circuitry. Xenon lamps have low efficacy. For example, a Xenon lamp with twice the diameter may provide only half the brightness of a mercury based CCFL lamp. Because the efficacy of the Xenon lamp may be less than half of a CCFL lamp, the additional power needed to power a Xenon based circuit creates a problem of power consumption.

Conventional LED drive circuits have been implemented on conventional rigid circuit boards. Side-lighting LEDs can be used with a rigid circuit board, however, side-lighting LEDs are relatively expensive. Side-lighting LEDs are available in a limited height range, which may not be appropriate for all applications, especially lighting a light pipe. An alternative to using side-lighting LEDs is to use multiple rigid circuit boards. For example, "daughter" cards can be connected to "motherboards" in a perpendicular configuration. Such perpendicular connection require connectors that consume substantial space and may have reliability problems.

SUMMARY

This invention provides a flexible circuit board mounted with top-light LEDs and LED control circuits that provides a convenient and space efficient way to backlight an LCD.

In one aspect, a light emitting diode device has a light emitting diode, a light emitting diode drive circuit, and a flexible circuit board. The flexible circuit board has a tab region. The light emitting diode and the light emitting diode drive circuit are mounted on a first side of the flexible circuit board. The tab region is folded such that the light emitting diode emits light toward a center region of the flexible circuit board.

In another aspect, a liquid crystal display device has a light pipe, a light emitting diode, a light emitting diode control circuit, a flexible circuit board, a light extracting surface, a diffuser, a reflective polarizer, and a liquid crystal display. The flexible circuit board has a tab region. The light emitting diode and the light emitting diode control circuit are connected with the tab region of the flexible circuit board such that the light emitting diode emits light into the light pipe. The light extracting surface is located near a first side of the light pipe. The diffuser is located near a second side of the light pipe. The first and second sides are opposite each other. The reflective polarizer is located above the diffuser. The liquid crystal display is located above the reflective polarizer. The light pipe emits light that passes through the diffuser, the reflective polarizer, then the liquid crystal display.

In a further aspect, a light emitting diode has a top lighting light emitting diode, a light emitting diode drive circuit, and a flexible circuit board having a tab region. The tab region of the flexible circuit board is folded at substantially a right angle relative to a center region of the flexible circuit board. The light emitting diode is mounted with a first side of the tab region. The light emitting diode drive circuit is mounted on a second side of the tab region.

Other systems, methods, features, and advantages of the invention will be or will become apparent to one skilled in the art upon examination of the following figures and detailed description. All such additional systems, methods, features, and advantages are intended to be included within this description, within the scope of the invention, and protected by the accompanying claims.

BRIEF DESCRIPTION OF THE DRAWINGS

The invention may be better understood with reference to the following figures and detailed description. The components in the figures are not necessarily to scale, emphasis being placed upon illustrating the principles of the invention.

DESCRIPTION OF THE PREFERRED EMBODIMENTS

Figure 1:
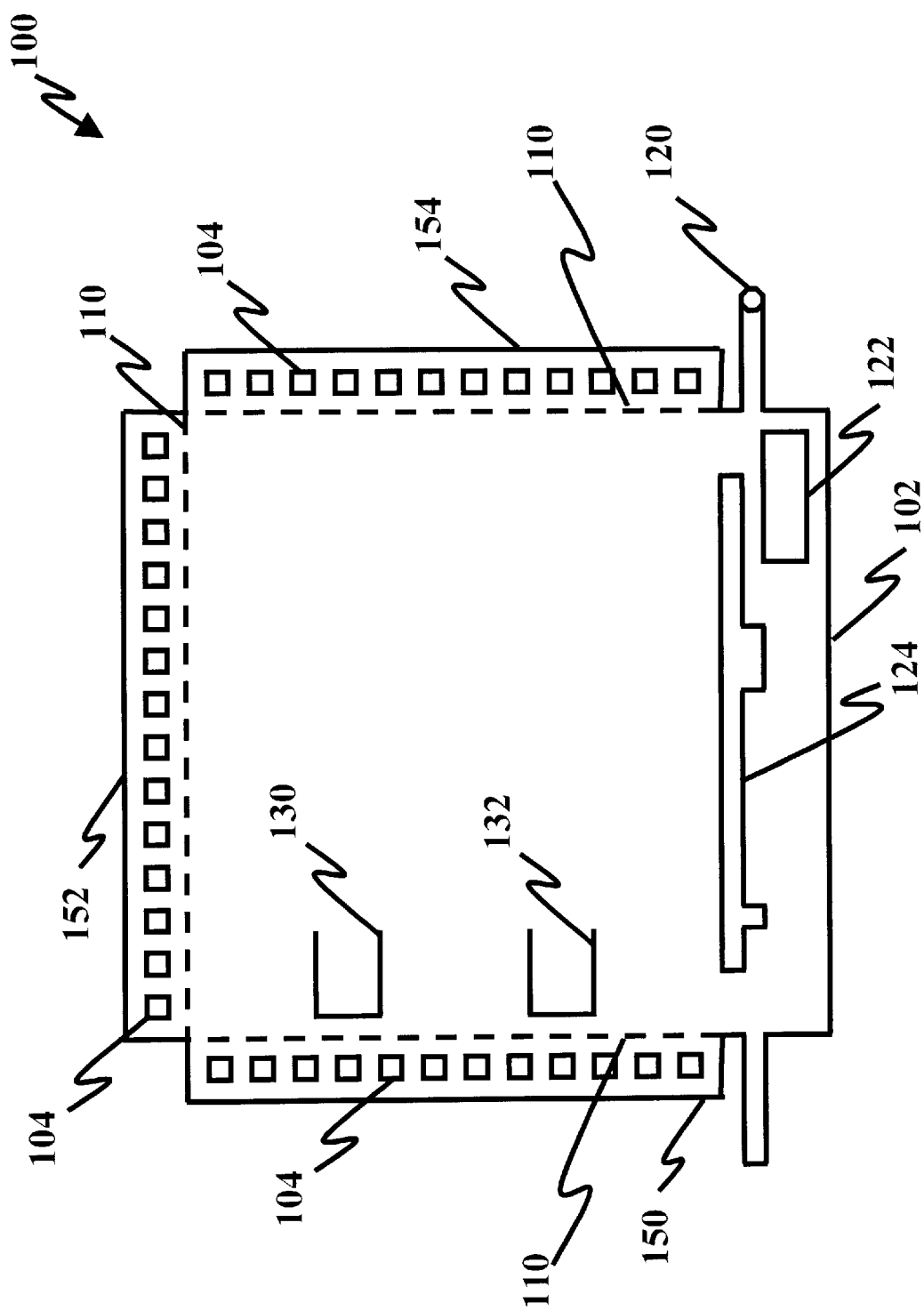
FIG. 1 represents a flexible LED circuit board with top-light LEDS on single-fold tabs according to an embodiment.

Top-light LEDs and the LED control circuit are mounted to a flexible circuit board to provide a cost effective and space efficient LCD backlighting device. Such flexible LED backlighting circuit may be used with various displays including LCDs and Active Matrix Liquid Crystal Displays ("AMLCD").

To achieve a desired luminance, many LEDs may be required. For example, a 3.8 inch display for an automotive application may require 50 LEDs or more. The number of LED may be significantly less than 50, for example 5, or significantly more, for example 5,000. As the number of LEDs increases, the LED drive method and interconnect system must be properly designed in order to obtain the maximum performance for all the LEDs.

An LED backlighting system should provide at least some of the following: adequate heat sinking, compatibility with CCFL implementations, LED control circuit located close to the LEDs, and a space efficient implementation.

LEDs may generate significant amount of heat that needs to be dissipated via heat sinking. The LED heat sink and heat removal method is important because of the luminance degradation of the LED and derating requirements as the LED's temperature increases. The luminance of LEDs decreases as a function of the LED solder point temperature with the relative luminous intensity equal to 1 at the LED solder point of 45.91 degrees Centigrade. Thus it is desirable to keep the LED temperature from rising in order to maintain the necessary luminous output.

It is desirable to be able to retrofit the new LED backlighting circuit into an existing CCFL backlighting system. CCFL backlighting systems normally have CCFL located around the perimeter of a light pipe. This configuration keeps the display thickness to a minimum while providing excellent light diffusion. This configuration is difficult to implement using LEDs since only top-lighting LEDS, for example "Power TOPLED®" available from Infineon Technologies Corp., 1730 N. First Street, San Jose, Calif. 95112, provide adequate luminous output. Top-lighting LEDS, unlike side-lighting LEDS, must be soldered to a circuit board which is perpendicular to the plane of the display. Other methods, such as total internal reflection ("TIR") methods, require special light pipe designs and do not allow an adequate LED control circuit location without significantly changing the mechanical designs of current AMLCD systems. Since it is desirable to have a LED device that is compatible with existing CCFL systems, a top lighting LED systems with properly placed LED control circuits is required.

A top lighting LED is an LED that emits light generally perpendicular to the plane of the circuit board that the LED is attached to. For example, a top lighting LED that is attached to a horizontal circuit board may emit light generally upward. Such a top lighting LED is the "Power TOPLED" available from Infineon Technologies, OSRAM, and OSRAM OPTO Semiconductors. A side lighting LED is an LED that emits light generally parallel to the plane of the circuit board that the LED is attached to. For example, a side lighting LED that is attached to a horizontal circuit board may emit light generally horizontally.

The LED control circuit should be located near the LEDs especially for parallel drive LED control circuit method. By locating the LED control circuit near the LEDs, the number of interconnects is reduced and the LEDs are easier to drive and control.

It is desirable to connect the LED control circuit in a similar way so as to avoid having to significantly change the AMLCD mechanical design. Conventional CCFL based backlights usually have a two wire interconnect harness connecting the CCFLs to a voltage inverter.

FIG. 1 represents a flexible circuit board-based device 100 according to an embodiment. The flexible circuit board-based device 100 includes a flexible circuit board 102 and various devices mounted on the flexible circuit board 102. While the flexible circuit board 102 is shown in a completely flat position, when in use, the flexible circuit board 102 may have the tabs 150, 152, and 154 folded along the dashed lines 110. The tabs 150, 152, and 154 may be folded at substantially 90 degrees such that the LEDs 104 face inwardly and are substantially perpendicular to the surface of the center region of the flexible circuit board 102. The LEDs 104 may be on the top side of the flexible circuit board 102 and the LED control circuits may be on the opposite side, for example, directly beneath the LEDs 104. Stiffeners may be added to the flexible circuit board 102 in areas without circuits or signal lines. The top and bottom side of the flexible circuit board 102 may be an exposed ground plane interconnected by thermal vias with some signal lines connecting the devices.

Similar to the flexible circuit board 202 (FIG. 2), the flexible circuit board 102 includes ground tabs 130 and 132, cutout 124, and various circuits 122. The temperature sensor may correspond to the thermal resistor RT1 of FIG. 4 and is located on the opposite side of the flexible circuit board 102 then the LEDs 104. The dimensions of the tabs 150,152, and 154 may be substantially similar to the tabs 250, 252, and 254 (FIG. 2) or different, for example half as wide.

Figure 2:
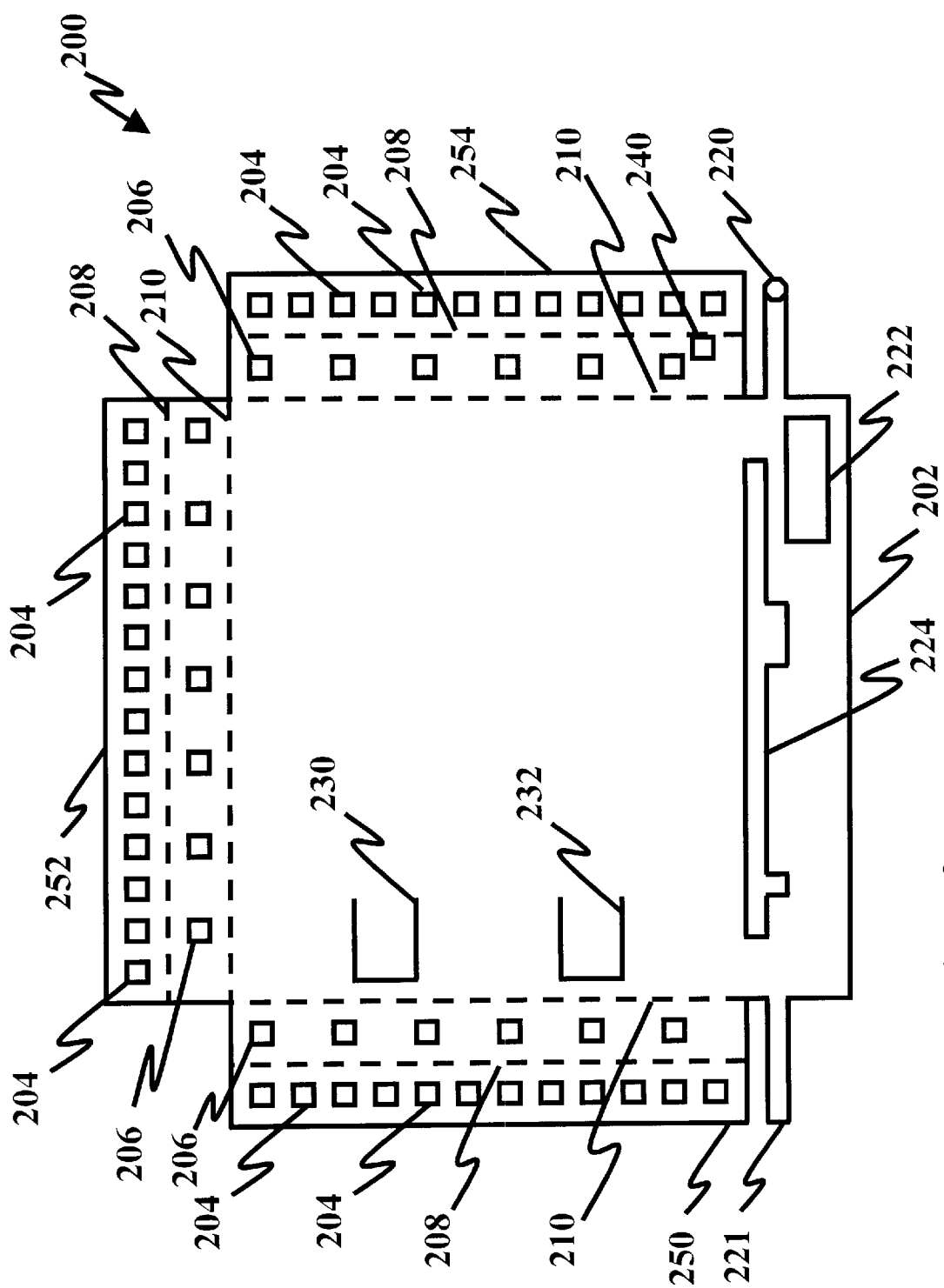
FIG. 2 represents a flexible LED circuit board with top-light LEDS on two-fold tabs according to another embodiment.

FIG. 2 represents a flexible circuit board-based device 200 according to another embodiment. The flexible circuit board-based device 200 includes a flexible circuit board 202 and various devices including an LED drive circuit. The LED drive circuit may be the parallel LED circuit 400 (FIG. 4), a series drive circuit, or other type of drive circuit. While the flexible circuit board 202 is shown in a completely flat position, when in use, the flexible circuit board 202 may have the tabs 250, 252, and 254 folded along the dashed lines 208 and 210. The folds may be at substantially 45 degrees such that the LEDs 204 face inwardly and are substantially perpendicular to the surface of the center region of the flexible circuit board 202. Such a folded flexible circuit board 202 is illustrated in cross-section in FIG. 3 as flexible circuit board 316. Other configurations may also be used including the single fold configuration described with reference to FIG. 1.

While FIG. 2 illustrates 12 to 14 LEDs per tab region, other number of LEDs may be used, for example, 2 to 200 LEDs per tab region. The number of LEDs per each tab may be, but need not be, the same. Different types of LEDs may be used on a flexible circuit board 202. Likewise, while FIG. 2 illustrates a two to one ratio of LED control circuits 206 to LEDs 204, the number of LED control circuits 206 may vary depending on the application.

The flexible circuit board 202 may be any flexible circuit board material, such as Standard Flex, Novaflex® HD, and Novaflex® VHD, available from Sheldahl Inc. of 1150 Sheldahl Road, Northfield, Minn. 55057.

The LEDs 204 may be located around the perimeter of the flexible circuit board 202. The folding of the flexible circuit board 202 enables the LEDs 204 and the LED control circuits 206 and other related circuits, for example circuit 222, to be located on one single of the flexible circuit board 202. The circuit 222 may correspond to circuits 406, 408 and 410 of FIG. 4. The temperature sensor 240, may correspond to the thermal resistor RT1 of FIG. 4. Such a single sided component placement is desirable for cost and manufacturability reasons. Additionally, having all the components located on the top side of the flexible circuit board 202 permits the use of stiffeners, for example 326 (FIG. 3), across potions of the bottom side of the flexible circuit board 202. The stiffener may be a polyester-based stiffener material.

The flexible circuit board 202 may be used to directly substituted CCFL circuits with little or no mechanical modifications. The flexible circuit board 202 eliminates the rear metal shield, provides a location for the LED control circuit 206, and utilizes a flexible interconnect for power and PWM control.

The top surface of the flexible circuit board 202 may include an exposed ground plane. The ground plane may include a majority of the central region of the flexible circuit board 202 and regions in the tabs 250, 252 and 254 that are not used for routing power and signals between the LEDs 204, the LED control circuits 206, and the other circuits 222. The bottom side of the flexible circuit board 202 may include an exposed voltage plane and signal routing lines.

Optionally, the flexible circuit board 202 may include ground tabs 230 and 232. The ground tabs 230 and 232 may be flexible tabs that can be inserted into an existing LCD frame to connect the ground plane of the flexible circuit board 202 to the frame. The ground plane on the top of the flexible circuit board 202 may be connected directly with a frame to provide LED heat sinking by connecting the cathodes of the LEDs to a heat sinking device, such as a metal frame. Such heat sinking results in a passive LED cooling method that is more cost effective than the other methods such as thermal electric coolers or spring clips. While the flexible circuit board 202 costs more than traditional rigid circuit boards, directly mounting the LEDs 204 and the LED control circuits 206 to the flexible circuit board 202 eliminates the need for daughter boards or other interconnecting devices or the more expensive side-lighting LEDs.

Also, the flexible circuit board 202 may include various cutouts, such as cutout 224, so that the flexible circuit board 202 may directly replace a CCFL device. Additionally, mounting tabs 220 and 221 and other devices may be integrated into the flexible circuit board 202 to allow the flexible circuit board 202 to directly replace a CCFL device or other device.

Figure 3:
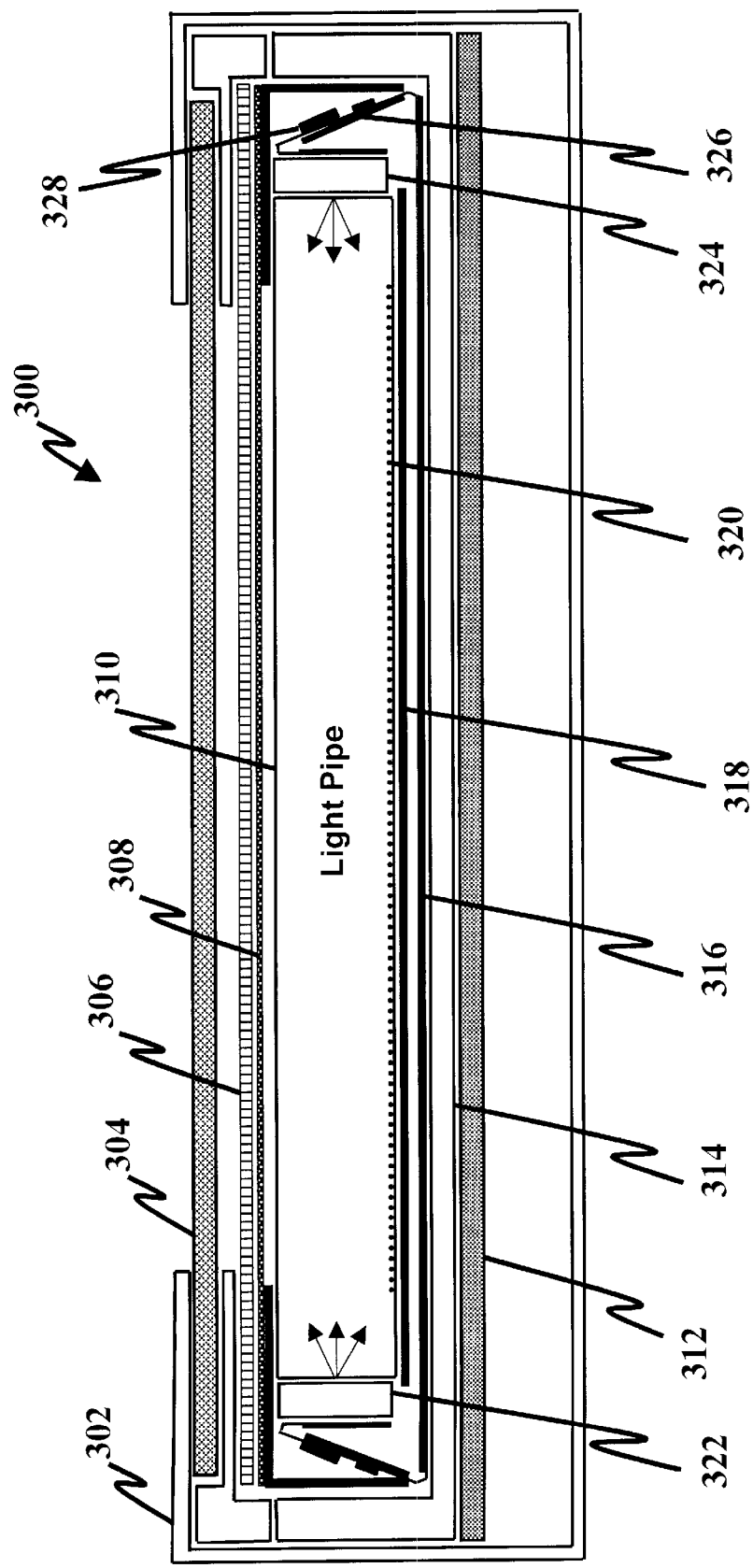
FIG. 3 represents an embodiment of a display that includes a liquid crystal display and a back lighting LED array.

FIG. 3 represents an AMLCD device 300 having a flexible circuit board 316 according to an embodiment that allows top-light LEDs 322 and 324 to be mounted on the flexible circuit board 316. FIG. 3 shows the AMLCD device 300 in cross-section. The flexible circuit board 316 corresponds to the flexible circuit board 202 of FIG. 2 with two-fold tabs 250, 252, and 254.

The AMLCD device 300 may also include a frame 302, an AMLCD 304, a reflective polarizer 306, a diffuser 308, and a light pipe 310. The frame 302 may be a metal frame or other type of frame. The reflective polarizer 306 may be a dual brightness enhancement film—diffuse ("DBEF-D") reflective polarizer. The DBEF-D reflective polarizer 306 allows only light that is properly polarized/orientated to pass to the AMLCD 304.

The AMLCD device 300 may also include LEDs 322 and 324, a printed rigid circuit board 312, a frame member 314, a flexible circuit board 316, an enhanced diffuse reflector ("EDR") 318, a light extracting surface 320, one or more stiffeners 326, and LED control circuits 328. The frame member 314 may be a metal frame that conducts heat from the flexible circuit board 316. The EDR 318 scrambles the polarization of the light and reflects the light toward the diffuser 308. The flexible circuit board 316 may have stiffeners 326 on the center portion of the flexible circuit board 316 and on the folded tabs as illustrated in FIG. 3 by the thicker regions of the flexible circuit board 316. For example, stiffeners 326 may be located on the opposite side of the flexible circuit board 316 from the LEDs 322 and 324, on the opposite side of the flexible circuit board 316 from the LED control circuits 328, and in the center portion of the flexible circuit board 316 opposite the exposed ground plane.

The flexible circuit board 316 may include two folds in each tab as illustrated in FIG. 3. The LED control circuits 328 may be on a first folded region of the tabs and the LEDs 322 and 324 may be on the second folded region of the tabs. The folds of the tabs of the flexible circuit board 316 may form substantially 45 degree angles, such that the LEDs 322 and 324 are perpendicular to the surface of the center region of the flexible circuit board 316 The LEDs 322 and 324 and the LED control circuits 328 are located on the same side of the flexible circuit board 316.

The flexible circuit board 316 may also provide the heat sinking capability and interconnection. The center portion of the flexible circuit board 316 may include an exposed ground plane that is in contact with the frame member 314 for transferring heat generated by the LEDs to the frame member 314.

The flexible circuit board 316 may be capable of small bend radiuses less than 1 mm and may be extremely thin, such as 2 mils thick with 35$\mu$ of copper on both sides totaling approximately 3.8 mils. The base insulator may be Kapton-based substance, such as Polyimide, that is extremely resilient to environmental and mechanical stresses. Eight mil space and trace is available for the less expensive HD material. The flexible circuit board 316 also aids in thermal heat sinking. The cathodes ends of the LEDs 322 and 324 may be soldered to a ground plane on the flexible circuit board 316 that is connected with a frame member 314 for heat sink the LEDs' heat. The heat flow path may dissipate toward the rear of the LCD display 300. The LCD 304 may be a 3.8" AMLCD.

An optional thermal conductive material may be located between the flexible circuit board 316 and the frame member 314 to improve the thermal conductivity. Such a thermal conductive material is especially important when an air gap exists between the flexible circuit board 316 and the frame member 314. The thermal conductive material may be a pressure sensitive adhesive (PSA) material such as Bond Ply™, which is available from The Bergquist Company in Chanhassen, Minn.

Figure 4:
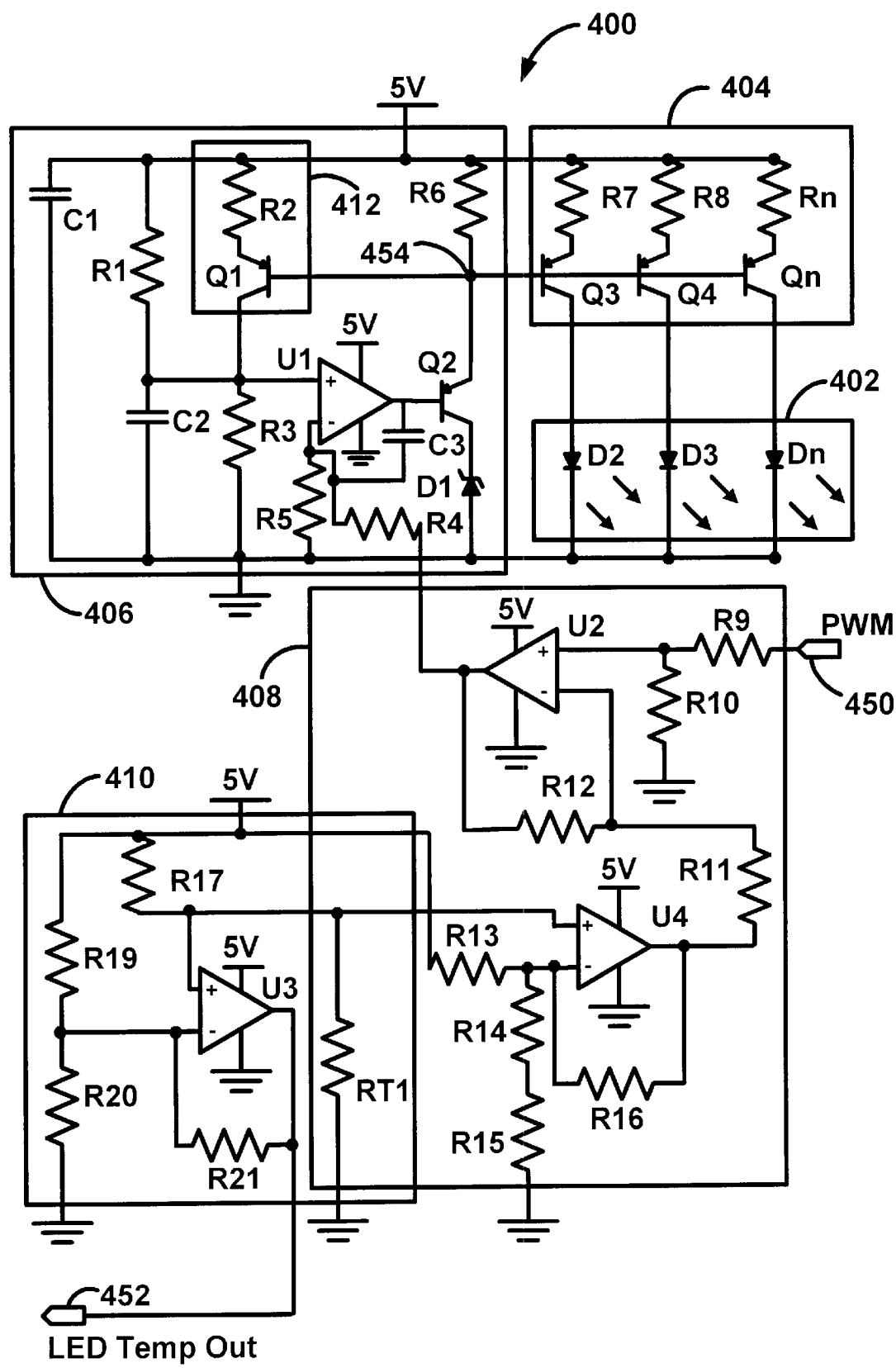
FIG. 4 represents a circuit diagram of an LED circuit according to an embodiment.

FIG. 4 represents an embodiment of a parallel LED circuit 400. The LED circuit 400 may include a parallel LED array 402, a current source circuit 404, a control circuit 406, an optional temperature derating circuit 408, and an optional temperature monitoring circuit 410.

The parallel LED array 402 includes a plurality of LEDs D2, D3, and Dn connected in parallel. The LEDs may be white or colored LEDs, such as red, green, and blue LEDs, other colored LEDs, or a combination of different types of LEDs. The LED labeled "Dn" represents the nth LED where n is the total number of diodes. While FIG. 4 illustrates only three LEDs in the LED array 402, the LED array 402 may have any number of LEDs, for example 2 to 1,000 LEDs for some applications and many more LEDs, such as 50,000, for other applications. There is no limit to the number of LED that could be in the LED array 402. Any additional LEDs will have corresponding current source transistors and emitter resistors in a similar configuration as the current source transistors Q3, Q4, and Qn and the emitter resistors R7, R8, and Rn.

The LEDs D2, D3, and Dn may each be separately current sourced to provide consistent LED brightness. This eliminates most brightness variations caused by LED forward voltage variations. The cathode terminals of each of the LEDs D2, D3, and Dn are connected with ground at a ground node. The common ground connection may be connected with a heat sink to transfer heat away from the LEDs. The anode terminal of the LEDs D2, D3, Dn connects with the current source transistor Q3, Q4, Qn. By connecting the cathode terminal of the parallel LEDs D2, D3, and Dn diodes to ground, a superior thermal conductive path is established that reduces the LED junction temperature and equalizes the junction temperatures among the parallel diodes. Since the luminous intensity of an LED decreases dramatically as the junction temperature increases, equalization of the junction temperatures helps maintain a more uniform brightness among the LEDs D2, D3, and Dn.

The current source circuit 404 supplies the LED array 402 with substantially uniform current to each LED, D2, D3, and Dn. Since the brightness of an LED is directly related to the current passing through the LED, accurate control of the LED current allows proper LED performance and life expectancy. The anode terminals of the LEDs D2, D3, and Dn are connected with a collector terminal of the respective current source transistor, Q3, Q4, and Qn. A common control node interconnects the base terminals of the current source transistors Q3, Q4, and Qn. The emitter terminals of the current source transistors, Q3, Q4, and Qn, are connected to the supply voltage via an emitter resistor R7, R8, and Rn, respectively. The current source transistors, Q3, Q4, and Qn may have substantially identical characteristics. Thus, the characteristic of the current source transistors, Q3, Q4, and Qn with respect to various collector currents ("Ic") and base to emitter voltages (Vbe) will be substantially similar since the transistor temperatures will be substantially identical. The base terminals of the current source transistors, Q3, Q4, and Qn are connected at a common control node 454.

The emitter resistors R7, R8, and Rn further reduce variations in the current from the current source transistors, Q3, Q4, and Qn. Thus, the parallel LEDs D2, D3, and Dn maintain consistent brightness. The emitter resistor R7, R8, and Rn preferably may have substantially identical characteristics. When the LEDs, D2, D3, and Dn, are white LEDs, the emitter resistors R7, R8, and Rn may be 0.1 to 1,000 Ohm resistors. The emitter resistors R7, R8, and Rn preferably have low resistance, such as 5 Ohms. When color diodes are being driven by the current source circuit 404, the value of the emitter resistors R7, R8, and Rn may be selected to achieve a different desired current level for each LED to achieve proper white balance.

The control circuit 406 provides fault tolerance protection when one or more LEDs in the LED array 402 fails. An LED may fail by a short or an open. When an LED fails open, the LED disconnects the collector terminal of the current source transistor. When an LED fails closed, the LED connects the collector terminal of the current source transistor to ground. Such LED failures tend to affect the voltage at the common control node 454 of the current source transistors. The control circuit 406 stabilizes the voltage at the common base node via feedback circuitry. When the voltage at the common base node is stable, the remaining LEDs continue to be driven at the prescribed level.

The transistor Q2 and the zener diode D1 provide load dumping when an LED fails open. The current that would have passed through the LED is diverted to the base terminal of the current source transistor connected with the LED that is open. This additional current is received by the transistor Q2 and dissipated through the zener diode D1. The number of LEDs that may fail in the open position while the LED circuit 400 remains operational is limited by the power rating of the transistor Q2 and the zener diode D1. For example, a zener diode D1 with a derated power limit of 500 mW allows for four open LEDs. A resistor or other device may alternatively by used in place of the zener diode D1.

An LED failure by a short is an unlikely failure. However, if an LED shorts out, the current source transistor associated with that LED continues to supply the shorted LED with the same current as the other LEDs. Thus, the brightness of the other LED is unaffected by the shorted LED.

A sample current source circuit 412 includes a transistor Q1 and a resistor R2 that have characteristics that are substantially similar to those of the current control transistors Q3, Q4, and Qn and the emitter resistors R7, R8, and Rn. By mirroring the characteristics of the current source circuit, the current through the sample current source circuit 412 may be monitored to estimate the current that passes through the LEDs. The sample current source circuit 412 provides a current substantially similar to the current that passes through each of the LEDs, D2, D3, Dn. The sample current is converted by a resistor R3 to a reference voltage. The sample current source circuit 412 eliminates the need for additional circuitry to sample the actual current through the LEDs, D2, D3, Dn. The sample current source circuit 412 allows the cathodes of the LEDs, D2, D3, Dn to be connected with the ground node instead of sampling circuitry. The resistor R1 provides an offset to ensure that the LEDs can be completely turned off even with a small output voltage at node 450 commonly associated with PWM controllers.

The control circuit 406 uses a current feedback circuit to more precisely control the current to the parallel LEDs. The additional control allows the parallel LEDs to be operated closer to their maximum rating, which is where the LEDs are at their brightest. The error amplifier U1 of the control circuit 406, may be configured to provide a bandwidth limiting function that eliminates high rate of change currents transients. This elimination reduces or completely suppresses electromagnetic interference (EMI) emissions.

The error amplifier U1, an operational amplifier, typically operates in a linear mode of operation. The input to the error amplifier U1 receives a voltage divided output from the operational amplifier U2. The output voltage from operational amplifier U2 is divided by the voltage divider formed by the resistors R4 and R5.

The temperature derating circuit 408 derates current to the LED array 402 as the temperature increases to prolong the life expectancy of the LEDs.

The temperature derating circuit 408 is connected with the control circuit 406 and an intensity input node 450. The input voltage from the operational amplifier U2 controls the brightness of the LED array 402. The operational amplifier U2 is configured as a differential amplifier where the ratios of the operational amplifier's resistors are substantially balanced, that is R12/R11=R10/R9. When the ratios of the operational amplifier's resistor R12/R11 and R10/R9 are both substantially equal to one, the differential gain of the operational amplifier U2 is substantially unity. When the output of the operational amplifier U4 is at substantially ground during a non-derating condition, the operational amplifier U2 passes the input signal from input node 450 with the gain set by the resistor ratios, which may be a unity gain. The intensity level signal may be a steady DC voltage, a pulse width modulated signal, or another type of signal.

The derating operational amplifier U4 normally operates in a rail-to-rail mode. When the LED array 402 is operating in a normal operating temperature range, the output of the derating operational amplifier U4, known as the temperature derating level, is substantially ground. As the temperature of the LED array 402 increases, the temperature derating level increases after a predetermined LED threshold temperature is reached. Since the thermal resistor RT1 is connected with the same ground and preferably in close proximity to the LED array 402, the resistance of the thermal resistor RT1 varies as a function of the temperature of the solder near the cathode terminals of the LEDs D2, D3, and Dn. The thermal resistor RT1, also called a temperature sensor, has a resistance that varies as a function of a measured temperature. For example, the thermal resistor RT1 may be a model KT230 available from Infineon Technologies A.G. The model KT230 is a temperature dependent resistor with a resistance tolerances of +/−3% at 1,000 Ohms, a temperature range of −50 degree Centigrade to +150 degree Centigrade, and is available in SMD or leaded or customized packages. The model KT230 has a linear output, a positive temperature coefficient, a long term stability, a fast response time, and is polarity independent due to symmetrical construction. Other commonly available temperature sensors, such as models LM135 and LM50 from the National Semiconductor, Inc., may also be used.

The operational amplifier U2 receives a higher output voltage from the derating operational amplifier U4 through resistor R11. The output voltage from the derating operational amplifier U4 acts as a negative offset to the input voltage at the input node 450. By reducing the output voltage of the operational amplifier U2, the error amplifier U1 increases its output voltage which causes the voltage at the common base node 454 to be increased. This results in the current source transistors Q3, Q4, and Qn allowing less current to flow through the LED array 402. The LEDs D2, D3, and Dn then become less bright as the temperature increases. For example, if the input voltage at the input node 450 is 5 VDC and the temperature derating level is 1.5 V, the output of the operation amplifier U2 is 3.5V. The temperature derating circuit 408 may shut off the LED array 402 if the measured temperature reaches a predetermined temperature threshold.

The temperature monitoring circuit 410 provides a temperature output signal at output node 452 that indicates a temperature associated with the LED array 402. The LED temperature output signal may be a function of the LED temperature as measured by the thermal resistor RT1. The thermal resistor RT1 may be used for the temperature monitoring circuit 410 and the temperature derating circuit 408. The temperature monitor amplifier U3 monitors a voltage difference between a first voltage divider circuit R19 and R20 and a second voltage divider circuit R17 and RT1 to provide an output voltage that is proportional to the LED temperature. The output of the temperature monitor amplifier U3 is connected with the output node 452. The temperature monitoring output 452 may be used by an external controller to adjust the drive level to input 450 to compensate for LED luminance changes as a function of temperature.

The input node 450 of the LED circuit 400 may receive an input signal from a microprocessor or other controller. The input signal may be a pulse width modulated ("PWM") signal, a DC voltage signal, or other type of signal. A PWM input signal controls the intensity of the LED based on the duty cycle and/or the voltage level of the input signal. Generally, as the duty cycle of the input signal increases, the LEDs D2, D3, and Dn become brighter. A DC voltage input signal controls the intensity of the LED based the voltage level of the input signal. Generally, as the voltage level at the input node 450 increases, the LEDs D2, D3, and Dn become brighter.

The LED circuit 400 may operate with a supply voltage of between 1 volt to 15 volts, and preferably it operates at approximately 5 volts. Since the LED circuit 400 includes a parallel LED array 402, a high power converter and higher supply voltage commonly required for serial LED circuits is not required. The LED circuit 400 may be a band limited low electromagnetic interference circuit controlled by the values of R4, R5, C3, R3, and C2.

The LED circuit 400 of FIG. 4 may include components as indicated in Table 1. Other types of components and components of different values may also be used in the LED circuit 400.

TABLE 1

| Ref. | Description |
|------|-------------|
| C1 | A capacitor, for example a 1 uF capacitor. |
| C2-3 | A capacitor, for example a 0.01 uF capacitor. |
| Q1-4 | A PNP transistor, for example, a model MBT3906DW1T1 transistor from Motorola, Inc. that is available in a dual package. |
| Qn | A PNP transistor, for example, a model MBT3906DW1T1 transistor from Motorola, Inc. that is available in a dual package. |
| D1 | A Zener diode, for example a 3.3 volt Zener diode. |
| D2-3 | A light emitting diode. For example, white SIDELED Infineon model LWA67C, a white LED from Infineon model LW E673 or LW E67C, red LED model LSA677-Q, green LED model LTA673-R24, or a blue LED LBA673-N24 all from Infineon Technology AG. |
| Dn | A light emitting diode. For example, white SIDELED Infineon model LWA67C, a white LED from Infineon model LW E673 or LW E67C, red LED model LSA677-Q, green LED model LTA673-R24, or a blue LED LBA673-N24 all from Infineon Technology AG. |
| U1-4 | An operational amplifier, for example a model LMV321 available from National Semiconductor Corp. or a model TLC 2274 Rail-to-Rail Operational Amplifier available from Texas Instruments, Inc. |
| R1 | A resistor, for example a 4.99K Ohms resistor. Other resistance values may also be used, for example, 0.5K to 50K Ohms. |
| R2 | A resistor, for example a 5 Ohms resistor. Other resistance values may also be used, for example, 0.5 to 500 Ohms. |
| R3 | A resistor, for example a 100 Ohms resistor. Other resistance values may also be used, for example, 0.1 to 10K Ohms. |
| R4 | A resistor, for example a 16.5k Ohms resistor. Other resistance values may also be used, for example, 165 to 1650K Ohms. |
| R5 | A resistor, for example a 25K Ohms resistor. Other resistance values may also be used, for example, 250 to 2,500K Ohms. |
| R6 | A resistor, for example a 4.99K Ohms resistor. Other resistance values may also be used, for example, 0.5K to 50K Ohms. |
| R7 | A resistor, for example a 5 Ohms resistor. Other resistance values may also be used, for example, 0.5 to 500 Ohms. |
| R8 | A resistor, for example a 5 Ohms resistor. Other resistance values may also be used, for example, 0.5 to 500 Ohms. |
| Rn | A resistor, for example a 5 Ohms resistor. Other resistance values may also be used, for example, 0.5 to 500 Ohms. |
| R9-21 | A resistor, for example a 20K Ohms resistor. Other resistance values may also be used, for example, 200 to 200K Ohms. |
| RT1 | A resistor with a temperature dependant resistance, for example KT230 available from Infineon Technology A.G. |

Various embodiments of the invention have been described and illustrated. However, the description and illustrations are by way of example only. Other embodiments and implementations are possible within the scope of this invention and will be apparent to those of ordinary skill in the art. Therefore, the invention is not limited to the specific details, representative embodiments, and illustrated examples in this description. Accordingly, the invention is not to be restricted except in light as necessitated by the accompanying claims and their equivalents.

What is claimed is:

1. A light emitting diode (LED) device, comprising:
   a light emitting diode;
   a light emitting diode drive circuit;
   a flexible circuit board having a tab region;
   wherein the light emitting diode and the light emitting diode drive circuit are mounted on a first side of the flexible circuit board and wherein the light emitting diode is mounted on the tab region and the tab region is folded such that the light emitting diode emit light toward a center region of the flexible circuit board.

2. The LED device of claim 1, wherein the light emitting diode comprise a top-light light emitting diode.

3. The LED device of claim 2, further comprising:
   a stiffener attached with a second side of the flexible circuit board.

4. The LED device of claim 3, wherein the tab region of the flexible circuit board is folded twice.

5. The LED device of claim 4, wherein the tab region of the flexible circuit board is folded twice such that the light emitting diode emits light substantially parallel to a surface of the center region of the flexible circuit board.

6. The LED device of claim 4, wherein the light emitting diode drive circuit is mounted on a first portion of the tab region that is substantially at a forty-five degree angle relative to a surface of the center region of the flexible circuit board and the light emitting diode is mounted on a second portion of the tab region that is substantially perpendicular to the surface of the center region of the flexible circuit board.

7. The LED device of claim 6, further comprising a second stiffener attached on the second side of the flexible circuit board in the center region of the flexible circuit board.

8. The LED device of claim 1, wherein the first side of the flexible circuit board comprises an exposed ground plane that can be connected directly to a frame member.

9. The LED device of claim 8, wherein the exposed ground plane transfers heat generated by the light emitting diode to the frame member.

10. The LED device of claim 9, further comprising a thermally conductive material between the exposed ground plane and the frame member.

11. The LED device of claim 1, further comprising:
    a temperature sensor; and
    a temperature control circuit;
    wherein the temperature sensor and the temperature control circuit are mounted on the first side of the flexible circuit board and the temperature sensor and the temperature control circuit monitor a temperature of the light emitting diode.

12. A liquid crystal display (LCD) device, comprising:
    a light pipe;
    a light emitting diode;
    a light emitting diode control circuit;
    a flexible circuit board having a tab region;
    wherein the light emitting diode and the light emitting diode control circuit are mounted on the tab region and the tab region is folded such that the light emitting diode emit light into the light pipe;
    a light extracting surface located near a first side of the light pipe;
    a diffuser located near a second side of the light pipe, where the first and second sides are opposite each other;
    a reflective polarizer located above the diffuser; and
    a liquid crystal display located above the reflective polarizer;
    wherein the light pipe emits light that passes through the diffuser, the reflective polarizer, then the liquid crystal display.

13. The LCD device of claim 12, wherein the light emitting diode comprises a top lighting light emitting diode.

14. The LCD device of claim 12, further comprising a stiffener attached to a second side of the flexible circuit board.

15. The LCD device of claim 14, wherein the second side of the flexible circuit board is opposite to a first side where the light emitting diode is mounted.

16. The LCD device of claim 14, further comprising a second stiffener attached on the second side of the flexible circuit board in the center region of the flexible circuit board.

17. The LCD device of claim 12, wherein the tab region of the flexible circuit board is folded twice.

18. The LCD device of claim 17, wherein the light emitting diode drive circuit is mounted on a first portion of the tab region that is substantially at a forty-five degree angle relative to a surface of a center region of the flexible circuit board and the light emitting diode is mounted on a second portion of the tab region that is substantially perpendicular to the surface of the center region of the flexible circuit board.

19. The LCD device of claim 12, wherein a first side of the flexible circuit board comprises an exposed ground plane that can be connected directly to a frame member.

20. The LCD device of claim 19, wherein the exposed ground plane transfers heat generated by the light emitting diode to the frame member.

21. The LCD device of claim 20, further comprising a thermally conductive material between the exposed ground plane and the frame member.

22. The LCD device of claim 12, wherein the tab region of the flexible circuit board is folded twice such that the light emitting diode emits light substantially parallel to a surface of a central region of the flexible circuit board.

23. The LCD device of claim 12, further comprising:
    a temperature sensor; and
    a temperature control circuit;
    wherein the temperature sensor and the temperature control circuit are mounted on a first side of the flexible circuit board and the temperature sensor and the temperature control circuit monitor a temperature of the light emitting diode.

24. A light emitting diode (LED) device comprising:
    a top lighting light emitting diode;
    a light emitting diode drive circuit;
    a flexible circuit board having a tab region;
    wherein the tab region of the flexible circuit board is folded at substantially a right angle relative to a surface of a center region of the flexible circuit board and the light emitting diode is mounted on a first side of the tab region and the light emitting diode drive circuit is mounted on a second side of the tab region.

25. The LED device of claim 24, wherein a first side of the flexible circuit board comprises an exposed ground plane that can be connected directly to a frame member to transfer heat generated by the light emitting diode to the frame member.

26. The LED device of claim 25, further comprising a thermally conductive material between the exposed ground plane and the frame member.

* * * * *